US009837283B2

(12) United States Patent
Yokota et al.

(10) Patent No.: US 9,837,283 B2
(45) Date of Patent: Dec. 5, 2017

(54) POLISHING COMPOSITION

(71) Applicant: FUJIMI INCORPORATED, Kiyosu-shi, Aichi (JP)

(72) Inventors: Shuugo Yokota, Kiyosu (JP); Koichi Sakabe, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 12 days.

(21) Appl. No.: 14/442,525

(22) PCT Filed: Oct. 25, 2013

(86) PCT No.: PCT/JP2013/078967
§ 371 (c)(1),
(2) Date: May 13, 2015

(87) PCT Pub. No.: WO2014/077107
PCT Pub. Date: May 22, 2014

(65) Prior Publication Data
US 2016/0293436 A1  Oct. 6, 2016

(30) Foreign Application Priority Data

Nov. 15, 2012 (JP) ................................. 2012-251521

(51) Int. Cl.
C09K 13/06 (2006.01)
H01L 21/3105 (2006.01)
C09G 1/02 (2006.01)
C09K 3/14 (2006.01)

(52) U.S. Cl.
CPC .......... *H01L 21/31053* (2013.01); *C09G 1/02* (2013.01); *C09K 3/1436* (2013.01); *C09K 3/1463* (2013.01)

(58) Field of Classification Search
CPC ... C09G 1/00; C09G 1/02; C09G 1/04; C09K 3/1436; C09K 3/1463; H01L 21/31053; H01L 21/306; H01L 21/30604
USPC .... 252/79.1, 79.2, 79.3, 79.4; 438/691, 692, 438/693
See application file for complete search history.

(56) References Cited

U.S. PATENT DOCUMENTS

| 6,776,810 | B1* | 8/2004 | Cherian | B24B 37/044 |
| | | | | 106/3 |
| 6,821,897 | B2* | 11/2004 | Schroeder | C09G 1/02 |
| | | | | 257/E21.304 |
| 7,044,836 | B2* | 5/2006 | Sun | C09G 1/02 |
| | | | | 257/E21.304 |
| 8,419,970 | B2 | 4/2013 | Kamimura | |
| 2002/0056645 | A1* | 5/2002 | Taylor | C25D 5/18 |
| | | | | 205/103 |
| 2004/0209555 | A1 | 10/2004 | Sun et al. | |
| 2004/0229552 | A1* | 11/2004 | Cherian | B24B 37/044 |
| | | | | 451/41 |
| 2007/0075291 | A1* | 4/2007 | Paik | C09G 1/02 |
| | | | | 252/79.1 |
| 2007/0175104 | A1 | 8/2007 | Nishiyama et al. | |
| 2010/0009538 | A1 | 1/2010 | Kamimura | |
| 2012/0299158 | A1 | 11/2012 | Shinoda et al. | |
| 2013/0005219 | A1 | 1/2013 | Takemura et al. | |
| 2013/0146804 | A1* | 6/2013 | Mizuno | C09G 1/02 |
| | | | | 252/79.1 |

FOREIGN PATENT DOCUMENTS

| CN | 101305450 A | 11/2008 |
| CN | 102127370 A | 7/2011 |
| CN | 102473621 A | 5/2012 |
| JP | 2000-160138 A | 6/2000 |
| JP | 2009-289885 A | 12/2009 |
| JP | 2010-041037 A | 2/2010 |
| JP | 4872919 B2 | 2/2012 |
| JP | 2012-040671 A | 3/2012 |
| TW | 201139634 A1 | 11/2011 |
| WO | WO-2012/026329 A1 | 3/2012 |

OTHER PUBLICATIONS

Chinese Office Action dated Apr. 18, 2016 as received in corresponding Chinese Application No. 201380059960.9 and its English translation thereof.
Extended European Search Report dated Jun. 14, 2016 as received in corresponding European Application No. 13855106.4.
Chinese Office Action dated May 16, 2017 as received in corresponding Chinese Application No. 201380059960.9 and its English translation thereof.

* cited by examiner

*Primary Examiner* — Lan Vinh
(74) *Attorney, Agent, or Firm* — Foley & Lardner LLP

(57) ABSTRACT

Provided is a polishing composition which exhibits favorable storage stability and polishes a polishing object poor in chemical reactivity at a high speed.

The invention is a polishing composition which contains silica having an organic acid immobilized on a surface thereof, a dihydric alcohol having a molecular weight of less than 20,000 and a pH adjusting agent, the polishing composition having a pH of 6 or less.

8 Claims, No Drawings

POLISHING COMPOSITION

TECHNICAL FIELD

The present invention relates to a polishing composition used in a semiconductor device manufacturing process and a polishing method using the same.

BACKGROUND ART

In the semiconductor device manufacturing process, it is required to polish a polishing object poor in chemical reactivity such as a metal carbide, a metal nitride or a composite material of these at a high speed.

Many of the polishing compositions that have been used for polishing the above polishing object in the related art contain abrasive grains and an acid.

For example, in JP 2010-41037 A (U.S. Pat. No. 8,419,970), a polishing composition which contains silica and an organic acid having a sulfonic acid group or a phosphonic acid group and has a pH of from 2.5 to 5 is disclosed.

SUMMARY OF INVENTION

However, the polishing composition of the related art has a problem that the polishing rate of the polishing object poor in chemical reactivity as described above is still low. In addition, silica used as the abrasive grain has a problem that silica is inferior in storage stability in an acid state and thus is prone to aggregate.

Accordingly, an object of the invention is to provide a polishing composition which exhibits favorable storage stability and can polish a polishing object poor in chemical reactivity at a high speed.

The present inventors have conducted intensive studies to solve the above problem. As a result, it has been found out that the above problem can be solved by containing a dihydric alcohol having, a molecular weight of less than 20,000 in an acidic polishing composition together with silica having an organic acid immobilized on a surface, whereby the invention has been completed.

In other words, the invention is a polishing composition which contains silica having an organic acid immobilized on a surface thereof, a dihydric alcohol having a molecular weight of less than 20,000 and a pH adjusting agent, the polishing composition having a pH of 6 or less.

DESCRIPTION OF EMBODIMENTS

Hereinafter, the invention will be described.
<Polishing Composition>

The first of the invention is a polishing composition which contains silica having an organic acid immobilized on the surface thereof, a dihydric alcohol having a molecular weight of less than 20,000 and a pH adjusting agent, the polishing composition having a pH of 6 or less. Such a configuration makes it possible to exhibit favorable storage stability and to polish a polishing object poor in chemical reactivity at a high speed.

The detailed reason for that the use of the polishing composition of the invention makes it possible to polish a polishing object poor in chemical reactivity at a high speed is unknown, but the following mechanism is presumed.

The case in which the polishing object is silicon nitride will be described as an example. The zeta potential of silica having an organic acid immobilized on the surface is negative and the absolute value is great. In addition, the zeta potential of silicon nitride is positive at the same pH of 6 or less. For that reason, silica having an organic acid immobilized on the surface in the polishing composition electrically attracts silicon nitride rather than repels when the pH of the polishing composition is 6 or less. Consequently, the use of the polishing composition of the invention makes it possible to polish silicon nitride at a high speed.

In addition, silica not having an organic acid immobilized on the surface has the zeta potential of about 0 under an acidic condition and thus the repulsion between silica is less likely to occur. Furthermore, the hydroxyl group in silica not having an organic acid immobilized on the surface interacts with the dihydric alcohol that is added in the polishing composition, and thereby silica not having an organic acid immobilized on the surface is in a nearly hydrophobic state and thus aggregates with one another to subsequently sediment.

In contrast, silica having an organic acid immobilized on the surface that is used in the invention has a functional group derived from the organic acid other than the hydroxyl group. This functional group derived from the organic acid does not interact with the dihydric alcohol and thus silica maintains its inherent hydrophilicity. Furthermore, the zeta potential of silica having an organic acid immobilized on the surface is great under an acidic condition, and thus the electrical repulsion between silica having an organic acid immobilized on the surface occurs and the dispersion stability of silica having an organic acid immobilized on the surface is improved. Hence, it is considered that the storage stability of the polishing composition of the invention is favorable.

Incidentally, the above mechanism is a presumption, and thus the invention is not limited to the above mechanism in any way.

[Silica Having Organic Acid Immobilized on Surface]

Silica having an organic acid immobilized on the surface that is contained in the polishing composition of the invention is used as the abrasive grains and is silica obtained by chemically bonding an organic acid on the surface. Examples of silica described above may include fumed silica or colloidal silica, but colloidal silica is particularly preferable. The organic acid is not particularly limited, and examples thereof may include sulfonic acid, carboxylic acid and phosphoric acid, and sulfonic acid or carboxylic acid is preferable. Incidentally, the acidic group derived from the organic acid (for example, a sulfo group, a carboxyl group and a phosphoric acid group) is immobilized on the surface of "silica having an organic acid immobilized on the surface" that is contained in the polishing composition of the invention by a covalent bond (depending on the case, via a linker structure).

As silica having an organic acid immobilized on the surface, a synthetic product or a commercially available product may be used. In addition, silica having an organic acid immobilized on the surface may be used singly or as a mixture of two or more kinds.

The method to introduce these organic acids to the silica surface is not particularly limited, and there is a method in which the organic acid group is introduced to the silica surface in a state in which a protecting group is bonded thereto and then the protecting group is removed therefrom in addition to a method in which the organic acid group is introduced to the silica surface in the form of a mercapto group, an alkyl group or the like and then the introduced group is oxidized to sulfonic acid or carboxylic acid. In addition, it is preferable that the compound that is used when the organic acid is introduced to the silica surface has at least one functional group that can serve as an organic acid and moreover contains a functional group used in bonding with the hydroxyl group of the silica surface, a functional group introduced to control the hydrophobicity and hydrophilicity, and a functional group introduced to control the steric bulk.

As a specific method for synthesizing silica having an organic acid immobilized on the surface, it is possible to conduct the synthesis, for example, by the method described in "Sulfonic acid-functionalized silica through quantitative oxidation of thiol groups", Chem. Commun. 246-247 (2003) when sulfonic acid of a kind of organic acids is immobilized on the surface of silica. Specifically, it is possible to obtain silica having sulfonic acid immobilized on the surface by coupling a silane coupling agent having a thiol group such as 3-mercaptopropyltrimethoxysilane to silica and then oxidizing the thiol group with hydrogen peroxide. Alternatively, it is possible to conduct the synthesis, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000) when carboxylic acid is immobilized on the surface of silica. Specifically, it is possible to obtain silica having carboxylic acid immobilized on the surface by coupling a silane coupling agent containing a photoreactive 2-nitrobenzyl ester to silica and then irradiating with light.

The average primary particle size of silica having an organic acid immobilized on the surface in the polishing composition is preferably 5 nm or more, more preferably 7 nm or more and even more preferably 10 nm or more. There is an advantage that the polishing rate of the polishing object by the polishing composition is improved as the average primary particle size of silica having an organic acid immobilized on the surface increases.

In addition, the average primary particle size of silica having an organic acid immobilized on the surface in the polishing composition is preferably 150 nm or less, more preferably 120 nm or less and even more preferably 100 nm or less. There is an advantage that the occurrence of scratches on the surface of the polishing object after being polished using the polishing composition can be suppressed as the average primary particle size of silica having an organic acid immobilized on the surface decreases. Incidentally, the value of the average primary particle size of silica having an organic acid immobilized on the surface is calculated, for example, based on the specific surface area of silica having an organic acid immobilized on the surface measured by the BET method.

The average secondary particle size of silica having an organic acid immobilized on the surface in the polishing composition is preferably 10 nm or more, more preferably 15 nm or more and even more preferably 20 nm or more. There is an advantage that the polishing rate of the polishing object by the polishing composition is improved as the average secondary particle size of silica having an organic acid immobilized on the surface increases.

In addition, the average secondary particle size of silica having an organic acid immobilized on the surface in the polishing composition is preferably 200 nm or less, more preferably 180 nm or less and even more preferably 150 nm or less. There is an advantage that the occurrence of scratches on the surface of the polishing object after being polished using the polishing composition can be suppressed as the average secondary particle size of silica having an organic acid immobilized on the surface decreases. Incidentally, the value of the average secondary particle size of silica having an organic acid immobilized on the surface is calculated, for example, based on the specific surface area of silica measured by the light scattering method using a BET laser beam.

The content of silica having an organic acid immobilized on the surface in the polishing composition is preferably 0.0005% by weight or more, more preferably 0.001% by weight or more and even more preferably 0.005% by weight or more. There is an advantage that the polishing rate of the polishing object by the polishing composition is improved as the content of silica having an organic acid immobilized on the surface increases.

In addition, the content of silica having an organic acid immobilized on the surface in the polishing composition is preferably 10% by weight or less, more preferably by weight or less and even more preferably 1% by weight or less. There is an advantage that the friction with the material to be polished diminishes and the polishing rate of the layer containing a material different from the polishing object such as polycrystalline silicon or TEOS is further suppressed as the content of silica having an organic acid immobilized on the surface decreases.

Incidentally, it is possible to use silica having an organic acid immobilized above singly or as a mixture of two or more kinds.

[Dihydric Alcohol Having Molecular Weight of Less than 20,000]

The dihydric alcohol having a molecular weight of less than 20,000 that is used in the invention is not particularly limited but is preferably a compound represented by the following Chemical Formula (1).

[Chem. 1]

$$H\!-\!(\!O\!-\!R\!)_n\!-\!OH \qquad (1)$$

In Chemical Formula (1) above, R represents a substituted or unsubstituted linear or cyclic alkylene group and n is an integer of 1 or more.

The dihydric alcohol used may be a commercially available product or a synthetic product. In addition, the dihydric alcohol can be used singly or as a mixture of two or more kinds.

More specific examples of the dihydric alcohol may include methanediol, ethylene glycol (1,2-ethanediol), 1,2-propanediol, propylene glycol (1,3-propanediol), 1,2-butanediol, 1,4-butanediol, 1,2-pentanediol, 1,5-pentanediol, 1,6-hexanediol, 1,2-hexanediol, 1,5-hexanediol, 2,5-hexanediol, 1,7-heptanediol, 1,8-octanediol, 1,2-octanediol, 1,9-nonanediol, 1,2-decanediol, 1,10-decanediol, 1,12-dodecanediol, 1,2-dodecanediol, 1,14-tetradecanediol, 1,2-tetradecanediol, 1,16-hexadecanediol, 1,2-hexadecanediol, 2-methyl-2,4-pentanediol, 3-methyl-1,5-pentanediol, 2-methyl-2-propyl-1,3-propanediol, 2,4-dimethyl-2,4-dimethyl-pentanediol, 2,2-diethyl-1,3-propanediol, 2,2,4-trimethyl-1,3-pentanediol, dimethylol octane, 2-ethyl-1,3-hexanediol, 2,5-dimethyl-2,5-hexanediol, 2-methyl-1,8-octanediol, 2-butyl-2-ethyl-1,3-propanediol, 2,4-diethyl-1,5-pentanediol, 1,2-cyclohexanediol, 1,4-cyclohexanediol, 1,4-cyclohexane dimethanol, 1,2-cycloheptanediol, tricyclodecane dimethanol, hydrogenated catechol, hydrogenated resorcinol, hydrogenated hydroquinone, diethylene glycol, a polyalkylene glycol such as polyethylene glycol and polypropylene glycol and a polyester polyol.

Among these, ethylene glycol, propylene glycol, diethylene glycol, polyethylene glycol, and a polyalkylene glycol are preferable.

The molecular weight of the dihydric alcohol is required to be less than 20,000. It is difficult to handle the dihydric alcohol as the slurry by the influence that it is difficult to uniformly disperse it in the dispersion medium and it precipitates as a solid in a case in which the molecular weight thereof is 20,000 or more. In addition, for example, in the case of using a polymer such as polyethylene glycol as the dihydric alcohol, the weight average molecular weight is used as the molecular weight, and the weight average molecular weight thereof is required to be less than 20,000 and is preferably 10,000 or less and more preferably 5,000 or less. It is possible to sufficiently exert the advantage that the dihydric alcohol is uniformly dispersed in a dispersion medium and the polishing rate of the layer containing a material different from the polishing object such as polycrystalline silicon or TEOS is suppressed when the weight average molecular weight is in such a range. Incidentally, the weight average molecular weight of the polymer can be measured by gel permeation chromatography (GPCmethod).

The content of the dihydric alcohol in the polishing composition is preferably 0.0001% by weight or more, more preferably 0.0005% by weight or more and even more preferably 0.001% by weight or more. There is an advantage that the polishing rate of the layer containing a material different from the polishing object such as polycrystalline silicon or TEOS is further suppressed as the content of the dihydric alcohol increases.

In addition, the content of the dihydric alcohol in the polishing composition is preferably 10% by weight or less, more preferably 5% by weight or less and even more preferably 1% by weight or less. There is an advantage that the aggregation of the abrasive grains can be avoided as the content of the dihydric alcohol decreases.

[PH Adjusting Agent]

The value of pH of the polishing composition of the invention is 6 or less. The dissolution of polycrystalline silicon or TEOS begins in a case in which the pH is alkaline, and thus it is difficult to suppress the polishing rate of polycrystalline silicon, TEOS or the like using the polishing composition. In addition, the zeta potential of silicon nitride is negative when the pH is more than 6, and thus it is difficult to polish silicon nitride using the abrasive grains having a negative zeta potential at a high speed. The value of pH of the polishing composition is preferably 5 or less, more preferably 4.5 or less and even more preferably 4 or less from the viewpoint of further improvement in the polishing rate of silicon nitride by the polishing composition.

The value of pH of the polishing composition is also preferably 1.5 or more, more preferably 1.75 or more and even more preferably 2 or more. It is possible to further suppress the polishing rate of polycrystalline silicon, TEOS or the like on the pattern wafer as the pH of the polishing composition increases.

The polishing composition of the invention contains a pH adjusting agent in order to adjust the pH of the polishing composition to a desired value. It is possible to use the following acids or chelating agents as the pH adjusting agent.

Examples of the acid may include a carboxylic acid such as formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acids and nitro carboxylic acid or a sulfonic acid such as methanesulfonic acid, ethanesulfonic acid, benzenesulfonic acid, p-toluenesulfonic acid, 10-camphorsulfonic acid, isethionic acid and taurine. In addition, examples of the acid may include an inorganic acid such as carbonic acid, hydrochloric acid, nitric acid, phosphoric acid, hypophosphorous acid, phosphorous acid, phosphonic acid, sulfuric acid, boric acid, hydrofluoric acid, orthophosphoric acid, pyrophosphoric acid, polyphosphoric acid, metaphosphoric acid and hexametaphosphoric acid.

Examples of the chelating agent may include a polyamine, polyphosphonic acid, polyaminocarboxylic acid and polyaminophosphonic acid.

These pH adjusting agents can be used singly or as a mixture of two or more kinds. Among these pH adjusting agents, nitric acid, phosphoric acid, citric acid and maleic acid are preferable.

The addition amount of the pH adjusting agent is not particularly limited, and the addition amount may be appropriately selected such that the pH is in the above range.

[Dispersion Medium or Solvent]

In the polishing composition of the invention, a dispersion medium or solvent for dispersing or dissolving each component is usually used. As the dispersion medium or solvent, an organic solvent and water are considered, but it is preferable to contain water between the two. Water containing impurities as little as possible is preferable from the viewpoint of inhibition on the action of other components by the impurities. Specifically, pure water, ultrapure water or distilled water from which the impurity ions are removed by an ion exchange resin and the foreign matters are removed through filtration is preferable.

[Other Components]

The polishing composition of the invention may further contain other components such as abrasive grains other than silica having an organic acid immobilized on the surface, a complexing agent, a metal corrosion inhibitor, a preservative, an antifungal agent, an oxidant, a reductant and a surfactant if necessary. Hereinafter, the abrasive grains, the oxidant, the preservative and the antifungal agent will be described.

[Abrasive Grains Other than Silica Having Organic Acid Immobilized on Surface]

The abrasive grains other than silica having an organic acid immobilized on the surface used in the invent ion may be any of inorganic particles, organic particles and organic-inorganic composite particles. Specific examples of the inorganic particles may include particles composed of a metal oxide such as alumina, ceria and titania, silicon nitride particles, silicon carbide particles and boron nitride particles. Specific examples of the organic particles may include polymethyl methacrylate (PMMA) particles. The abrasive grains may be used singly or as a mixture of two or more kinds. In addition, the abrasive grains used may be a commercially available product or a synthetic product.

[Oxidant]

The oxidant contained in the polishing composition has an action to oxidize the surface of the polishing object and improves the polishing rate of the polishing object by the polishing composition.

Examples of the usable oxidant may include a peroxide. Specific examples of the peroxide may include hydrogen peroxide, peracetic acid, percarbonate salt, urea peroxide and perchloric acid as well as a persulfate salt such as sodium persulfate, potassium persulfate and ammonium persulfate. These oxidants may be used singly or as a mixture of two or more kinds. Among them, a persulfate salt and hydrogen peroxide are preferable and hydrogen peroxide is particularly preferable.

The content of the oxidant in the polishing composition is preferably 0.1 g/L or more, more preferably 1 g/L or more and even more preferably 3 g/L or more. The polishing rate of the polishing object by the polishing composition is improved as the content of the oxidant increases.

In addition, the content of the oxidant in the polishing composition is preferably 200 g/L or less, more preferably 100 g/L or less and even more preferably 40 g/L or less. It is possible to diminish the burden to treat the polishing composition after using for polishing/namely the effluent load in addition to the fact that the material cost of the polishing composition can be cut down as the content of the oxidant decreases. In addition, it is also possible to diminish the risk that excessive oxidation of the surface of the polishing object by the oxidant occurs.

[Preservative and Antifungal Agent]

Examples of the preservative and antifungal agent used in the invention may include an isothiazolin-based preservative such as 2-methyl-4-isothiazolin-3-one or 5-chloro-2-methyl-4-isothiazolin-3-one, a paraoxybenzoate ester and phenoxyethanol. These preservatives and antifungal agents may be used singly or as a mixture of two or more kinds.

<Method for Producing Polishing Composition>

The method for producing a polishing composition of the invention is not particularly limited, and for example, the polishing composition can be obtained by mixing silica having an organic acid immobilized on the surface, a dihydric alcohol having a molecular weight of less than 20,000, a pH adjusting agent and other components if necessary through stirring.

The temperature at the time of mixing the respective components is not particularly limited but is preferably from 10 to 40° C. and the mixture may be heated in order to increase the dissolution rate.

<Material to be Polished>

The material to be polished of the invention is not particularly limited, and examples thereof may include a material to be polished containing a polishing object such a metal carbide such as silicon carbide and boron carbide, a metal nitride such as silicon nitride, boron nitride, gallium nitride, titanium nitride and lithium nitride or a composite material of these. These polishing objects may be a single or a combination of two or more kinds. Incidentally, the polishing object may have a single layer structure or a multi-layer structure consisting of two or more kinds. Each layer may contain the same material or different materials in the case of a multi-layer structure.

Furthermore, it is preferable that the material to be polished in the invention have the above polishing object and a layer containing a material different from the polishing object. The use of the polishing composition of the invention makes it possible to enhance the affinity of the polishing object for silica having an organic acid immobilized on the surface and to lower the affinity of the layer containing a material different from the polishing object such as polycrystalline silicon or TEOS for silica having an organic acid immobilized on the surface. As a result, the use of the polishing composition of the invention makes it possible to polish the polishing object selectively, that is, at a higher polishing rate than the layer containing a material different from the polishing object while suppressing the polishing rate of the layer containing a material different from the polishing object.

The detailed reason for that the polishing object can be selectively polished by the polishing composition of the invention is unknown, but the following mechanism is presumed.

In the polishing composition of the invention, silica having an organic acid immobilized on the surface and a dihydric alcohol having a molecular weight of 20,000 or less are contained, and thus the hydroxyl group on the surface of silica having an organic acid immobilized on the surface interacts with the dihydric alcohol and thus the hydroxyl group of silica having an organic acid immobilized on the surface is partially covered while the zeta potential or hydrophilicity of the surface of silica having an organic acid immobilized on the surface are maintained. By virtue of this, the affinity of the layer containing a material different from the polishing object such as polycrystalline silicon or TEOS which is considered to be polished by the interaction with the hydroxyl group of silica for silica having an organic acid immobilized on the surface is lowered. As a result, the affinity of the material different from the polishing object for silica having an organic acid immobilized on the surface is lowered while the affinity of the polishing object for silica having an organic acid immobilized on the surface is maintained, and thus it is considered that it is possible to suppress the polishing rate of crystalline silicon, TEOS or the like and to selectively polish the polishing object such as silicon nitride at a high speed. In the case of using a polyhydric alcohol of more than dihydric, there are too many hydroxyl groups derived from the polyhydric alcohol and thus the affinity for polycrystalline silicon or the like is rather enhanced and the polishing rate of polycrystalline silicon or the like is insufficiently suppressed. Incidentally, the above mechanism is a presumption, and thus the invention is not limited to the above mechanism in any way.

Examples of the material different from the polishing object may include polycrystalline silicon, monocrystalline silicon, tetraethyl orthosilicate (TEOS) and silicon oxide. These materials may be a single or a combination of two or more kinds. Incidentally, the layer containing the material different from the polishing object may have a single layer structure or a multi-layer structure consisting of two or more kinds. Each layer may contain the same material or different materials in the case of a multi-layer structure.

Among these, it is preferable that the polishing object contains silicon nitride and the layer containing the material different from the polishing object contains at least either material of polycrystalline silicon or tetraethyl orthosilicate from the viewpoint that the effect of the invention can be more efficiently obtained.

<Polishing Method Using Polishing Composition>

As described above, the polishing composition of the invention is suitably used in polishing a material to be polished having a polishing object and a layer containing a material different from the polishing object. Hence, the second of the invention is a polishing method to polish a material to be polished having a polishing object and a layer containing a material different from the polishing object using the polishing composition of the invention. In addition, the third of the invention is a method for producing a substrate including a step of polishing a material to be polished having a polishing object and a material different from the polishing object by the above polishing method.

It is possible to polish using the apparatus and conditions used for usual metal polishing when polishing the material to be polished having a polishing object and a layer containing a material different from the polishing object using the polishing composition of the invention. There are single sided polishing apparatus and a double sided polishing apparatus as the general polishing apparatus. In the single sided polishing apparatus, the substrate is held using a holder called carrier, the polishing table on which the polishing pad is pasted is pressed against the facing surface of the substrate and rotated while supplying the polishing composition from upper part, thereby polishing one side of the material to be polished. At this time, polishing is conducted by the physical action due to the friction between the polishing pad and the polishing composition, and the material to be polished, and the chemical action which is produced on the material to be polished by the polishing composition. As the polishing pad, it is possible to use a porous body such as a nonwoven fabric, polyurethane and suede without particular limitation. The polishing pad is preferably subjected to a working so as to save the polishing liquid.

As the polishing conditions in the polishing method according to the invention, the polishing load, the rotation number of polishing table, the rotation number of carrier, the flow rate of polishing composition and polishing time are included. These polishing conditions are not particularly limited, and for example, the polishing load is preferably 0.1 psi or more and 10 psi or less, more preferably 0.5 psi or more and 8.0 psi or less and even more preferably 1.0 psi or more and 6.0 psi or less per unit area of the substrate. In general, the frictional force by the abrasive grains increases as the load is higher, thus the mechanical working force is improved, and the polishing rate increases as a result. In this range, a sufficient polishing rate is exerted and it is possible to suppress the damage of substrate by the load or the occurrence of the defect such as scratches on the surface. The rotation number of the polishing table and the rotation number of the carrier are preferably from 10 to 500 rpm. The supply amount of the polishing composition may be a supply amount by which the entire base of the material to be polished is covered and may be adjusted depending on the condition such as the size of the substrate.

The polishing composition of the invention may be a one pack type or a multi-pack type including a two pack type. In addition, the polishing composition of the invention may be prepared by diluting a stock solution of the polishing composition, for example, 10 times or more using a diluent such as water.

The polishing composition of the invention may be used in polishing materials other than the above material to be polished. Examples of such a material to be polished may include an inorganic insulating layer such as glass which is formed on a substrate, a layer containing Al, Cu, Ti, W, Ta and the like as the main component, an optical glass such as a photo mask, a lens and a prism, an inorganic conductive layer such as XTO, an optical integrated circuit, an optical switching element and an optical waveguide which are composed of glass and a crystalline material, an end face of the optical fiber, optical single crystal such as a scintillator, solid-state laser single crystal, a sapphire substrate for blue laser LED, semiconductor single crystal such as GaP and GaAs, a glass substrate for magnetic disk and a magnetic head.

EXAMPLES

The invention will be described in more detail with reference to the following Examples and Comparative Examples. However, the technical scope of the invention is not limited to only the following Examples.

Examples 1 to 6 and Comparative Examples 1 to 9

The polishing composition was prepared by mixing (mixing temperature: about 25° C. and mixing time: about 10 minutes) the abrasive grains, the dihydric alcohol, and the pH adjusting agent in water at the composition presented in Table 2. The pH of the composition was confirmed by a pH meter.

Incidentally, the kinds of the abrasive grains, the dihydric alcohol, the polyhydric alcohol and the material to be polished presented in Table 2 are presented in the following Table 1.

TABLE 1

Abrasive grains

A: silica having sulfonic acid immobilized on the surface (average primary particle size: 35 nm and average second particle size: 68 nm)
B: silica not having an organic acid immobilized on the surface (average primary particle size: 35 nm and average second particle size: 68 nm)
Divalent alcohol Ethylene glycol
Polyethylene glycol #400: polyethylene glycol having a weight average molecular weight of 400
Polyethylene glycol #600: polyethylene glycol having a weight average molecular weight of 600
Polyethylene glycol #2000: polyethylene glycol having a weight average molecular weight of 2000
Polyethylene glycol #20000: polyethylene glycol having a weight average molecular weight of 20000
Polyethylene glycol #50000: polyethylene glycol having a weight average molecular weight of 50000
Polyhydric alcohol Polyvinyl alcohol
Material to be polished Poly: polycrystal silicon
SiN: silicon nitride
TEOS: tetraethyl orthosilicate
Substrate to be polished Blanket: substrate consisting of any one layer of the above materials to be polished (Poly, SiN and TEOS)
Pattern wafer (PTW): either substrate of the following two
PTW1: substrate fabricated by laminating a SiN layer having a thickness of 400 Å on a Poly layer having a thickness of 500 Å
PTW2: substrate fabricated by laminating a SiN layer having a thickness of 400 Å on a TEOS layer having a thickness of 500 Å

Incidentally, the column of the polishing rate (pattern wafer) in Table 2 indicates the results obtained by measuring the polishing rate of polycrystalline silicon or TEOS which is the lower layer when polishing the pattern wafer.

<Storage Stability>

The storage stability was evaluated by confirming the change in the polishing rate of Poly, SiN, and TEOS when polished using the polishing composition which was stored for one week at 60° C. and the polishing composition which was stored for one week at 25° C. The storage stability is favorable in a case in which the change in the polishing rate falls within 10% and thus is denoted as ○. In addition, the storage stability is poor in a case in which the change in the polishing rate does not fall within 10% and thus is denoted as x. Moreover, it is denoted as XX in a case in which the polishing evaluation is hindered by the influence of the sedimentation of the abrasive grains or the precipitation of the dihydric alcohol as a solid.

The polishing rate was measured when the polishing object was polished using the polishing composition thus obtained under the following polishing conditions.

Polishing Condition
Polishing device: single sided CMP polishing device for 200 mm
Pad: polyurethane pad
Pressure: 1.8 psi
Rotation number of table: 97 rpm
Rotation number of carrier: 92 rpm
Flow rate of polishing composition: 200 ml/min
Polishing time: 1 minute The polishing rate was calculated by the following Equation.

Polishing rate[Å/min]=quantity of change in film thickness at the time of being polished for 1 minute Film thickness measuring device: optical interference type film thickness measuring device The results of the polishing rate measurement are presented in the following Table 2.

In addition, the polishing compositions of Examples exhibit favorable storage stability.

On the other hand, the polishing rate of polycrystalline silicon or TEOS was insufficiently suppressed in the case of the polishing compositions of Comparative Example 1, Comparative Example 3, Comparative Example 6 and Comparative Examples 8 and 9. The polishing rate of silicon nitride of the polishing object itself was low in the case of the polishing compositions of Comparative Examples 8 and 9. The polishing rate of polycrystalline silicon and TEOS was also insufficiently suppressed in Comparative Example 2 using polyvinyl alcohol of a polyhydric alcohol of more than dihydric. In addition, the dihydric alcohol was precipitated as a solid and thus it was not able to evaluate the polishing rate in the case of the polishing compositions of Comparative Examples 4 and 5. Moreover, the sedimentation of the abrasive grains occurred and thus it was not able to evaluate the polishing rate in the case of the polishing composition of Comparative Example 7.

TABLE 2

| | Abrasive grains | | pH adjusting agent | pH | Divalent alcohol | | Polishing rate (blanket wafer) [Å/min] | | | Polishing rate (pattern wafer) [Å/min] | | Storage stability |
|---|---|---|---|---|---|---|---|---|---|---|---|---|
| | Kind | Concentration | | | Kind | Concentration | Poly | SiN | TEOS | PTW1 (Poly) | PTW2 (TEOS) | |
| Example 1 | A | 6.0 wt % | Citric acid | 2.1 | Polyethylene glycol #400 | 0.02 wt % | 14 | 417 | 366 | 195 | 255 | o |
| Example 2 | A | 1.0 wt % | Citric acid | 2.1 | Polyethylene glycol #400 | 0.02 wt % | 13 | 305 | 82 | 151 | 234 | o |
| Example 3 | A | 0.6 wt % | Citric acid | 2.1 | Polyethylene glycol #400 | 0.02 wt % | 12 | 258 | 53 | 145 | 232 | o |
| Example 4 | A | 0.6 wt % | Citric acid | 3.0 | Polyethylene glycol #600 | 0.02 wt % | 13 | 222 | 17 | 80 | 173 | o |
| Example 5 | A | 0.6 wt % | Citric acid | 3.0 | Polyethylene glycol #2000 | 0.02 wt % | 11 | 212 | 15 | 74 | 155 | o |
| Example 6 | A | 0.6 wt % | Citric acid | 2.1 | Ethylene glycol | 0.02 wt % | 16 | 408 | 178 | 168 | 248 | o |
| Comparative Example 1 | A | 6.0 wt % | Citric acid | 2.1 | — | — | 43 | 405 | 400 | 288 | 651 | o |
| Comparative Example 2 | A | 6.0 wt % | Citric acid | 2.1 | Polyvinyl alcohol | 0.02 wt % | 120 | 409 | 403 | 410 | 680 | o |
| Comparative Example 3 | A | 0.6 wt % | Citric acid | 2.1 | — | — | 37 | 251 | 58 | 214 | 592 | o |
| Comparative Example 4 | A | 6.0 wt % | Citric acid | 2.1 | Polyethylene glycol #50000 | 0.02 wt % | — | — | — | — | — | xx |
| Comparative Example 5 | A | 6.0 wt % | Citric acid | 2.1 | Polyethylene glycol #20000 | 0.02 wt % | — | — | — | — | — | xx |
| Comparative Example 6 | B | 6.0 wt % | Citric acid | 2.1 | — | — | 36 | 307 | 677 | 280 | 825 | x |
| Comparative Example 7 | B | 6.0 wt % | Citric acid | 2.1 | olyethylene glycol #400 | 0.02 wt % | — | — | — | — | — | xx |
| Comparative Example 8 | B | 6.0 wt % | KOH | 10.0 | — | — | 1699 | 10 | 23 | 1795 | 50 | o |
| Comparative Example 9 | A | 0.6 wt % | KOH | 10.0 | olyethylene glycol #400 | 0.02 wt % | 892 | 21 | 18 | 964 | 48 | o |

As it is apparent from the results of the polishing rate (blanket wafer) presented in Table 2, it has been found out that the polishing rate of silicon nitride of the polishing object is high in the case of using the polishing compositions of the invention of Examples 1 to 6. Furthermore, it has been found out that the polishing rate of polycrystalline silicon or tetraethyl orthosilicate is suppressed. This is also supported by the results of the polishing rate (pattern wafer). In Incidentally, this application is based upon the prior Japanese Patent Application No. 2012-251521, filed on Nov. 15, 2012, the entire contents of which are incorporated herein by reference.

The invention claimed is:
1. A polishing composition comprising:
silica having an organic acid immobilized by a covalent bond on a surface thereof;

a dihydric alcohol, wherein the dihydric alcohol is a polyethylene glycol having a molecular weight of less than 20,000; and a pH adjusting agent, the polishing composition having a pH of 6 or less.

2. The polishing composition according to claim 1, wherein the organic acid is sulfonic acid or carboxylic acid.

3. The polishing composition according to claim 1, wherein a molecular weight of the dihydric alcohol is 5,000 or less.

4. The polishing composition according to claim 1, wherein a content of silica having an organic acid immobilized on the surface is 0.005% by weight or more and 1% by weight or less.

5. The polishing composition according to claim 1, wherein the polishing composition is used to polish a material to be polished having a polishing object and a layer containing a material different from the polishing object.

6. The polishing composition according to claim 5, wherein the polishing object is silicon nitride and the layer containing a material different from the polishing object contains at least either of polycrystalline silicon or tetraethyl orthosilicate.

7. A polishing method comprising:

a step of polishing a material to be polished by using the polishing composition according to claim 1, wherein the material to be polished has a polishing object and a layer containing a material different from the polishing object.

8. A method for producing a substrate, comprising:

a step of polishing a material to be polished by the polishing method according to claim 7, wherein the material to be polished has a polishing object and a material different from the polishing object.

* * * * *